United States Patent
Kawakami

(10) Patent No.: US 7,948,261 B2
(45) Date of Patent: May 24, 2011

(54) SEMICONDUCTOR INTEGRATED CIRCUIT DEVICE AND COUNTERMEASURE METHOD AGAINST NBTI DEGRADATION

(75) Inventor: Shinya Kawakami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 12/427,202

(22) Filed: Apr. 21, 2009

(65) Prior Publication Data

US 2009/0302884 A1 Dec. 10, 2009

(30) Foreign Application Priority Data

Jun. 9, 2008 (JP) ................................. 2008-150861

(51) Int. Cl.
*H03K 19/003* (2006.01)

(52) U.S. Cl. ............... 326/12; 326/15; 326/93; 327/295; 327/293; 327/99

(58) Field of Classification Search ............... 326/81–83, 326/93–98, 101; 327/291, 296–299, 99, 327/164–166, 172–176, 261–262, 284–285
See application file for complete search history.

(56) References Cited

U.S. PATENT DOCUMENTS

| 6,472,909 | B1 * | 10/2002 | Young | 327/99 |
| 6,819,140 | B2 * | 11/2004 | Yamanaka et al. | 326/93 |
| 6,975,154 | B1 * | 12/2005 | Pedersen | 327/295 |

FOREIGN PATENT DOCUMENTS

| JP | 2006-109091 | 4/2006 |
| JP | 2006-211494 | 8/2006 |

* cited by examiner

*Primary Examiner* — James H. Cho
*Assistant Examiner* — Christopher Lo
(74) *Attorney, Agent, or Firm* — Turocy & Watson, LLP

(57) ABSTRACT

A semiconductor integrated circuit device includes a target circuit of a low power consumption mode having at least one flip-flop circuit to which a clock signal is supplied in a normal operation mode and in a low power consumption mode, and a logic circuit to which each output of the at least one flip-flop circuit is input, wherein each of the flip-flop circuits includes a selector that selects a normal data signal in the normal operation mode, selects an inverted output of the flip-flop circuit in the low power consumption mode, based on an operation-mode switching signal that designates switching between the normal operation mode and the low power consumption mode, and inputs the selected signal to a data input terminal of the flip-flop circuit.

19 Claims, 5 Drawing Sheets

SEMICONDUCTOR INTEGRATED CIRCUIT DEVICE AND COUNTERMEASURE METHOD AGAINST NBTI DEGRADATION

CROSS-REFERENCE TO RELATED APPLICATIONS

This application is based upon and claims the benefit of priority from the prior Japanese Patent Application No. 2008-150861, filed on Jun. 9, 2008; the entire contents of which are incorporated herein by reference.

BACKGROUND OF THE INVENTION

1. Field of the Invention

The present invention relates to a semiconductor integrated circuit device and a countermeasure method against NBTI degradation.

2. Description of the Related Art

In a flip-flop circuit included in a semiconductor integrated circuit device, when a high-level or low-level fixed value is input in a low power consumption mode, there is a part in a circuit where a fixed-value negative bias voltage is applied to a gate electrode of a P-channel metal oxide semiconductor (PMOS) transistor. In such a PMOS transistor applied with the fixed-value negative bias voltage, electric current does not flow and the PMOS transistor becomes an ON state. When this situation is repeated, a degradation phenomenon referred to as negative bias temperature instability (NBTI) occurs. In addition, in a logic circuit to which an output of the flip-flop circuit is input, because a high-level or low-level fixed value output from the flip-flop circuit is transmitted under the above circumstances, the fixed-value negative bias voltage can be applied to the gate electrode of the PMOS transistor in the logic circuit. If the fixed-value negative bias voltage is actually applied thereto, the PMOS transistor in the logic circuit simply becomes an ON state without any current flow, and therefore deterioration due to NBTI similarly occurs in the PMOS transistor in the logic circuit.

The NBTI is a degradation phenomenon (change with time passage) that tends to occur with downsizing of PMOS transistors and development of low-voltage PMOS transistors. That is, the NBTI is a phenomenon such that when a PMOS transistor is maintained simply in an ON state without any current flowing in a certain temperature environment, and when an electric field having high field strength is applied to a gate oxide film, electric charge is captured by a shallow trap of a low energy level formed in the gate oxide film, and as a result, a threshold voltage of the PMOS transistor is raised and biased to a negative side. When the threshold voltage shifts to the negative side, a drive current (drain current) at the time of an operation of the PMOS transistor used by flowing current decreases, thereby causing a problem of performance degradation.

When a data path in the flip-flop circuit is degraded due to NBTI in a low power consumption mode, a setup time margin of the flip-flop circuit decreases at the time of operating in a normal operation mode. Further, when NBTI degradation occurs in a clock path, an erroneous operation due to clock skew occurs because a delay variation amount due to the degradation is different in each path.

Conventionally, therefore, a timing analysis is performed in a low power consumption mode as measures against NBTI at the time of designing, and a library for a timing adjusting cell is designed, taking into consideration a time margin after NBTI degradation.

However, in a designing method taking the time margin after NBTI degradation into consideration, an over margin is generated. This causes problems such that a circuit size increases to incur cost increase, circuit characteristics deteriorate due to interruption of a high-speed operation, and further cost increase is incurred due to a prolonged development period.

Meanwhile, as a designing method not taking a time margin after NBTI degradation into consideration, for example, there are techniques disclosed in JP-A 2006-109091 (KOKAI) and JP-A 2006-211494 (KOKAI). However, these patent applications only disclose a technique for preventing the occurrence of erroneous operations due to clock skew mentioned above, and do not disclose measures against performance degradation due to NBTI degradation in a data path in a flip-flop circuit.

BRIEF SUMMARY OF THE INVENTION

According to one aspect of the present invention, a semiconductor integrated circuit device includes a target circuit of a low power consumption mode having at least one flip-flop circuit to which a clock signal is supplied in a normal operation mode and in a low power consumption mode, and a logic circuit to which each output of the at least one flip-flop circuit is input, wherein each of the flip-flop circuits includes a selector that selects a normal data signal in the normal operation mode, selects an inverted output of the flip-flop circuit in the low power consumption mode, based on an operation-mode switching signal that designates switching between the normal operation mode and the low power consumption mode, and inputs the selected signal to a data input terminal of the flip-flop circuit.

According to another aspect of the present invention, a semiconductor integrated circuit device includes a plurality of flip-flop circuits, to each clock terminal of which a clock signal is input; and a logic circuit to which respective outputs of the flip-flop circuits are input, wherein a plurality of selectors are provided respectively on an input side of each of the flip-flop circuits, which select a normal data signal to be input to the flip-flop circuits in a normal operation mode, and select an inverted output of the flip-flop circuits in a low power consumption mode, based on an operation-mode switching signal that designates switching between the normal operation mode and the low power consumption mode, and input the selected signal to a data input terminal of each of the flip-flop circuits.

According to still another aspect of the present invention, a countermeasure method against NBTI degradation in a semiconductor integrated circuit device, which includes a target circuit of a low power consumption mode having at least one flip-flop circuit to which a clock signal is supplied in a normal operation mode and in a low power consumption mode, and a logic circuit to which each output of the at least one flip-flop circuit is input, the method includes selecting and inputting a normal data signal to a data input terminal of each of the flip-flop circuits in the normal operation mode; and selecting and inputting an inverted output of each of the flip-flop circuits to the data input terminal of each of the flip-flop circuits in the low power consumption mode.

DETAILED DESCRIPTION OF THE INVENTION

Figure 1:
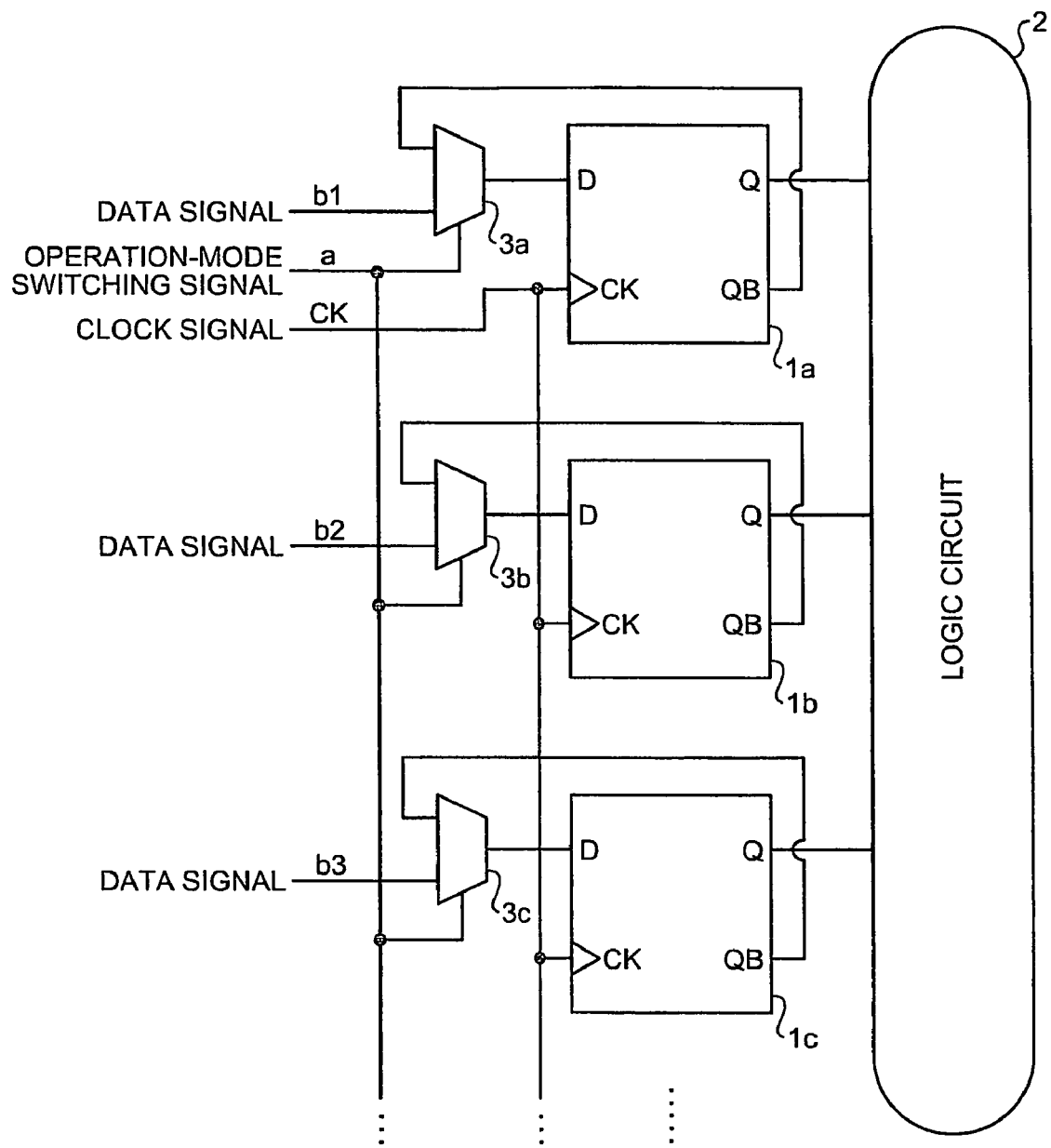
FIG. 1 is a block diagram of a configuration of relevant parts of a semiconductor integrated circuit device according to a first embodiment of the present invention.

FIG. 1 is a block diagram of a configuration of relevant parts of a semiconductor integrated circuit device according to a first embodiment of the present invention. In FIG. 1, in the semiconductor integrated circuit device, as at least one flip-flop circuit (hereinafter, "FF circuit"), which is a target circuit of the low power consumption mode, and a logic circuit to which each output of the at least one FF circuit is input, for example, FF circuits 1a, 1b, and 1c, and a logic circuit 2 to which respective data outputs (Q output) of the FF circuits 1a, 1b, and 1c are shown.

As shown in FIG. 1, selectors 3a, 3b, and 3c are provided on a side of data input terminals D of respective FF circuits 1a, 1b, and 1c. As an arrangement relationship of the selectors 3 (3a, 3b, and 3c) with respect to the FF circuits 1 (1a, 1b, and 1c), the arrangement relationship is shown by dividing it by functions in FIG. 1 and other drawings. However, as the actual arrangement relationship, needless to say, there are cases that the selectors 3 (3a, 3b, and 3c) are arranged as a part of the FF circuits 1 (1a, 1b, and 1c) in a forming region of the FF circuits 1 (1a, 1b, and 1c) and that the selectors 3 are arranged outside the forming region of the FF circuits 1 (1a, 1b, and 1c).

One input of the selectors 3a, 3b, and 3c is an output signal of an inverting output terminal QB (Q bar) of the corresponding FF circuit, and the other input of the selectors 3a, 3b, and 3c is a data signal b1, a data signal b2, or a data signal b3 in a normal operation. However, in the first embodiment, a clock signal CK in a normal operation mode is input to a clock input terminal CK of the FF circuits 1a, 1b, and 1c, even in the low power consumption mode.

A common operation-mode switching signal "a" is provided to the selectors 3a, 3b, and 3c so that the selectors perform the same switching operation. The operation-mode switching signal "a" is a binary level signal indicating high level and low level for designating switching between the normal operation mode and the low power consumption mode.

That is, when the operation-mode switching signal "a" is the one level signal for designating the normal operation mode, the selectors 3a, 3b, and 3c select the data signals b1, b2, and b3 in the normal operation to input the signals to the data input terminal D. When the operation-mode switching signal "a" is the other level signal for designating the low power consumption mode, the selectors 3a, 3b, and 3c select the output signal of the inverting output terminal QB to input the signal to the data input terminal D.

Figure 2:
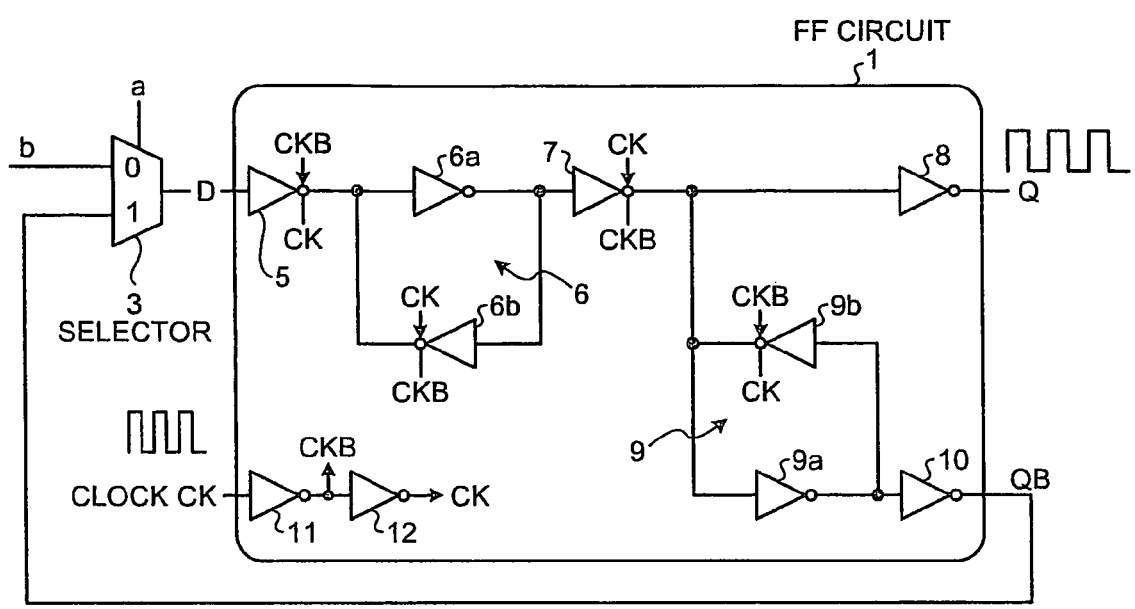
FIG. 2 is a circuit diagram of a configuration example of a flip-flop circuit shown in FIG. 1.

FIG. 2 is a circuit diagram of a configuration example of the flip-flop circuit shown in FIG. 1. In FIG. 2, one FF circuit 1 and the selector 3 corresponding thereto are shown as a basic configuration of the FF circuit.

In FIG. 2, an inverter circuit 5 to which the output of the selector 3 is input, a latch circuit 6 to which the output of the inverter circuit 5 is input, an inverter circuit 7 to which the output of the latch circuit 6 is input, an inverter circuit 8 that logically inverts the output of the inverter circuit 7 and transmits the output to the Q output terminal, a latch circuit 9 to which the output of the inverter circuit 7 is input, and an inverter circuit 10 that logically inverts the output of the latch circuit 9 and transmits the output to the QB output terminal are arranged in a data path of the FF circuit 1. The latch circuit 6 includes inverter circuits 6a and 6b connected in anti-parallel with each other. The latch circuit 9 includes inverter circuits 9a and 9b connected in anti-parallel with each other. Further, inverter circuits 11 and 12 that logically invert the clock signal CK input to the clock terminal CK over two stages are provided on the clock path.

These inverter circuits have, respectively, a CMOS configuration. The inverter circuits 5, 6b, 7, and 9b have a switching function. The inverter circuits 5 and 9b respectively operate as a switch that allows passage of the input signal by a clock signal CKB logically inverted by the inverter circuit 11, but inhibits passage of the input signal by the clock signal CK obtained by returning the logic to an original state by the inverter circuit 12. The inverter circuits 6b and 7 respectively operate as a switch that inhibits passage of the input signal by the clock signal CKB logically inverted by the inverter circuit 11 but allows the passage of the input signal by the clock signal CK obtained by returning the logic to the original state by the inverter circuit 12.

In an example shown in FIG. 2, when the operation-mode switching signal "a" provided to the selector 3 is at a low level "0", it designates the normal operation mode, and at a high level "1", the signal designates the low power consumption mode. Accordingly, when the operation-mode switching signal "a" is at the low level "0", the selector 3 selects the data signal b input in the normal operation and transmits the data signal to the data input terminal D, and when the operation-mode switching signal "a" is at the high level "1", the selector 3 selects the signal of the inverting output terminal QB of the FF circuit 1 and transmits the signal to the data input terminal D.

According to this configuration, because a fixed value is not input to the clock terminal CK of the FF circuit 1 even in the low power consumption mode and the clock signal is input thereto as at the time of the normal operation, the clock path (the inverter circuits 11 and 12) in the FF circuit 1 is insusceptible to NBTI degradation, and thus clock skew due to the NBTI degradation does not occur.

Further, when it is in the low power consumption mode, in the data path in the FF circuit 1, not a fixed value but a toggle signal obtained by dividing the clock signal CK by two flows. Therefore, the current flows through the PMOS transistor in the respective inverter circuits so that the PMOS transistor performs the same operation as at the time of the normal operation and is activated. That is, NBTI degradation in the data path in the FF circuit 1 can be reduced.

In the low power consumption mode, not the fixed value but the toggle signal is output from the Q output terminal of the FF circuit to the logic circuit 2, a logic gate in the logic circuit 2 is activated and NBTI degradation is reduced similarly to the above.

As described above, according to the first embodiment, the clock path and the data path in the respective FF circuits are activated. Accordingly, the NBTI degradation in the FF circuit and the logic circuit, to which the output of the FF circuit are input, can be effectively suppressed as a whole.

Figure 3:
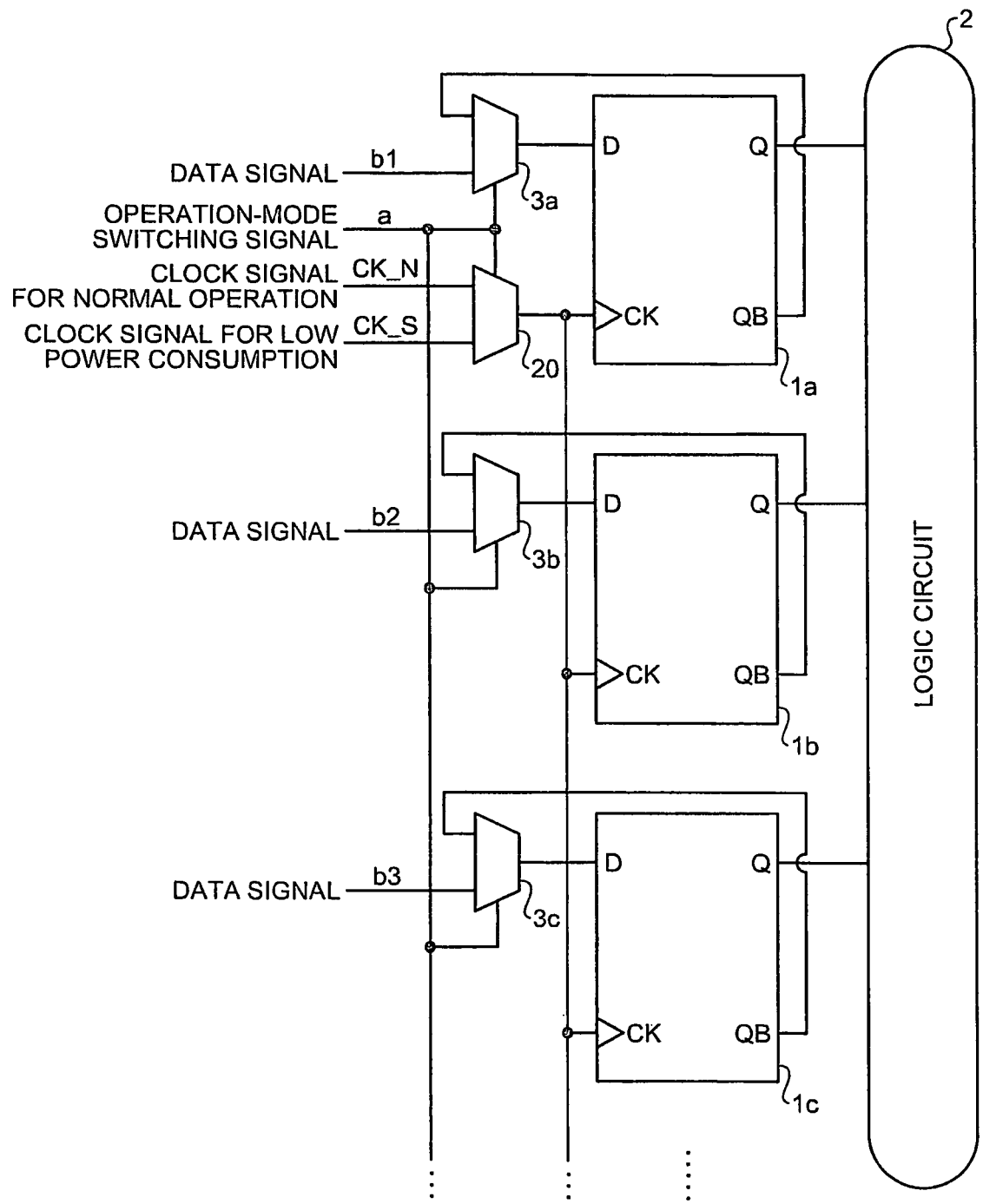
FIG. 3 is a block diagram of a configuration of relevant parts of a semiconductor integrated circuit device according to a second embodiment of the present invention.

FIG. 3 is a block diagram of a configuration of relevant parts of a semiconductor integrated circuit device according to a second embodiment of the present invention. In FIG. 3, same reference characters refer to identical or similar elements shown in FIG. 1 (the first embodiment). Parts relevant to the second embodiment are mainly explained below.

The first embodiment has described a case that the clock signal used in the normal operation mode is provided to the FF circuit even at the time of the low power consumption mode. On the contrary, the second embodiment describes a case that a clock signal used at the low power consumption mode different from the clock signal used in the normal operation mode is provided to the FF circuit in the low power consumption mode.

As shown in FIG. 3, in the semiconductor integrated circuit device according to the second embodiment, a selector 20, which is a clock selector, is added in the configuration shown in FIG. 1 (the first embodiment).

A clock signal CK_N for a normal operation and a clock signal CK_S for low power consumption are input to the selector 20. The output terminal of the selector 20 is commonly connected to the clock input terminal CK of the FF circuits 1a, 1b, and 1c. A switching control signal to the selector 20 is the operation-mode switching signal "a" same as in the case of the selector 3.

In the example shown in FIG. 3, the selector 20 selects the clock signal CK_N for a normal operation and transmits the signal to the clock input terminal CK when the operation-mode switching signal "a" is at the low level "0", or selects the clock signal CK_S for low power consumption and transmits the signal to the clock input terminal CK when the operation-mode switching signal "a" is at the high level "1".

The clock signal for activating the FF circuit in the low power consumption mode needs to have a frequency lower than that of the clock signal in the normal operation mode to suppress power consumption. In this regard, in the first embodiment, a case that the clock signal in the normal operation mode is commonly used has been described, focusing on the operation characteristic of the FF circuit.

Figure 4:
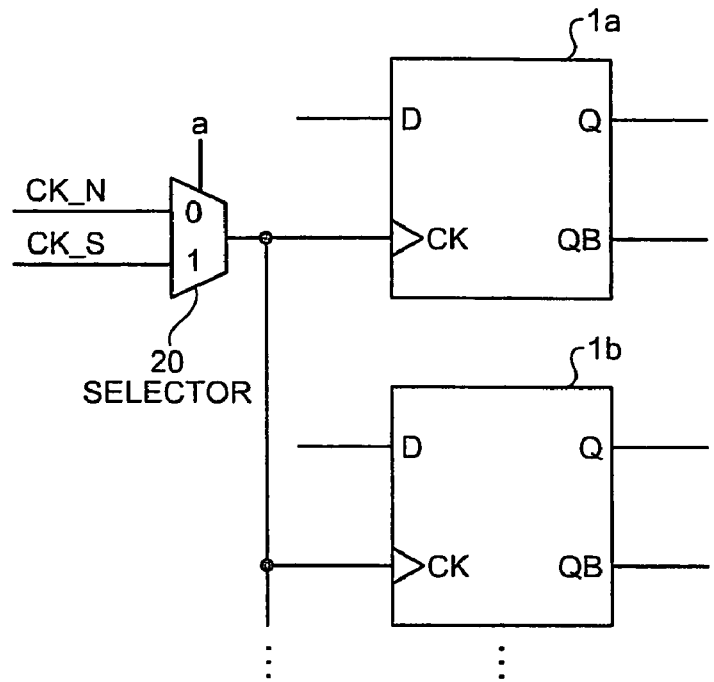
FIG. 4 is a circuit diagram of a configuration example of a clock supply system with respect to a flip-flop circuit shown in FIG. 3.
Figure 5:
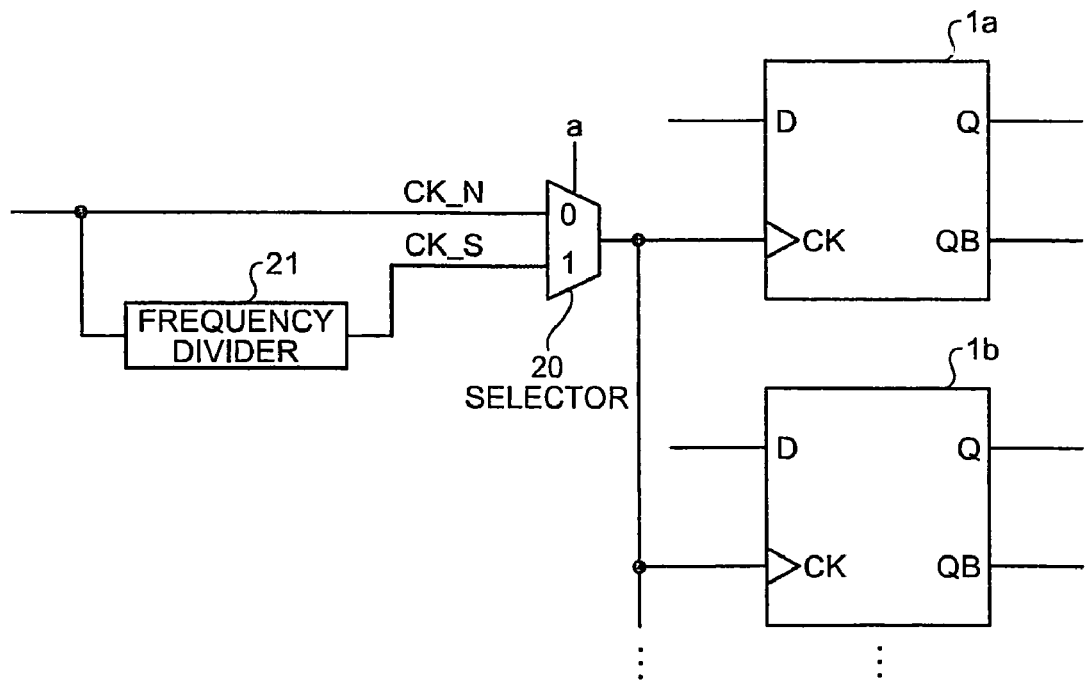
FIG. 5 is a circuit diagram of another configuration example of the clock supply system with respect to the flip-flop circuit shown in FIG. 3.
Figure 6:
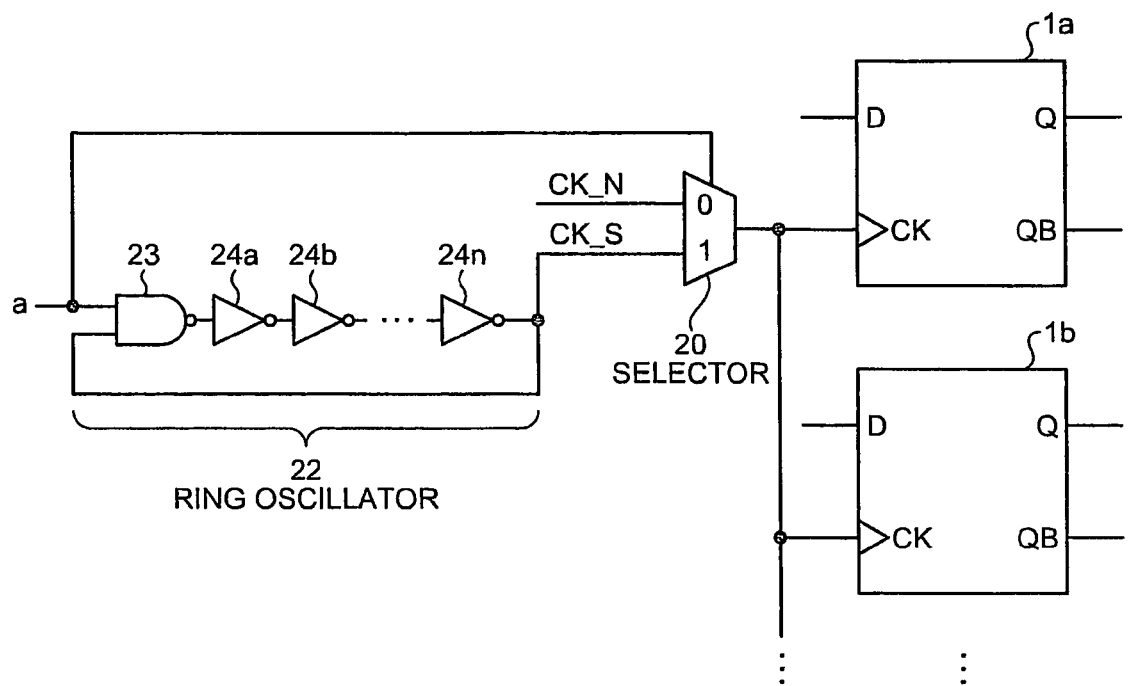
FIG. 6 is a circuit diagram of still another configuration example of the clock supply system to the flip-flop circuit shown in FIG. 3.

As a method of providing a low-frequency clock signal than the frequency of the clock signal in the normal operation to the FF circuit, for example, there are three methods shown FIG. 4 to FIG. 6. A supply system of the low-frequency clock signal for activating the FF circuit in the low power consumption mode according to the second embodiment is explained with reference to FIGS. 4 to 6.

FIG. 4 is a circuit diagram of a configuration example of a clock supply system with respect to the flip-flop circuit shown in FIG. 3. In FIG. 4, the clock signal CK_S for low power consumption is a clock signal having a lower frequency than that of the clock signal CK_N for a normal operation, and is generated outside the target circuit of the low power consumption mode. That is, a circuit for generating the clock signal CK_S for low power consumption is provided outside the target circuit of the low power consumption mode.

FIG. 5 is a circuit diagram of another configuration example of the clock supply system with respect to the flip-flop circuit shown in FIG. 3. As shown in FIG. 5, a frequency divider 21 is provided in a clock supply path to the FF circuit. The clock supply path is in the target circuit of the low power consumption mode or outside the target circuit. The frequency divider 21 divides the frequency of the clock signal CK_N for a normal operation to generate the clock signal CK_S for low power consumption.

FIG. 6 is a circuit diagram of still another configuration example of the clock supply system to the flip-flop circuit shown in FIG. 3. As shown in FIG. 6, a ring oscillator 22 is provided in the clock supply path to the FF circuit. The clock supply path is in the target circuit of the low power consumption mode or outside the target circuit.

In this example, because the operation-mode switching signal "a" designates the low power consumption mode at the high level "1", the ring oscillator 22 has a configuration such that odd numbers of inverter circuits 24a, 24b, 24n are cascade-connected on an output side of a NAND circuit 23, to one input terminal of which the operation-mode switching signal "a" is provided, and an output of the inverter circuit 24n on a final stage of the odd numbers of cascade-connected inverter circuits is returned to the other input terminal of the NAND circuit 23 on the input side.

Because the ring oscillator 22 repeats oscillations at a cycle corresponding to a time while the logic value "1" makes a round of a loop, in a period while the operation-mode switching signal "a" is at the high level "1", the inverter circuit 24n on the final stage outputs the low-frequency clock signal CK_S for low power consumption in a period of the low power consumption mode.

According to the second embodiment, in the low power consumption mode, because the FF circuit is activated by a low frequency clock signal that is lower than the first embodiment, the power consumption can be suppressed more than the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a target circuit of a low power consumption mode having at least one flip-flop circuit to which a clock signal is supplied in a normal operation mode and in a low power consumption mode, and a logic circuit to which each output of the at least one flip-flop circuit is input, wherein
each of the flip-flop circuits includes a selector that selects a normal data signal in the normal operation mode, selects an inverted output of the flip-flop circuit in the low power consumption mode, based on an operation-mode switching signal that designates switching between the normal operation mode and the low power consumption mode, and inputs the selected signal to a data input terminal of the flip-flop circuit.

2. The device according to claim 1, further comprising a clock selector that selects a clock signal for a normal operation in the normal operation mode, selects a clock signal for low power consumption in the low power consumption mode, based on the operation-mode switching signal, and inputs the selected clock signal to each of the flip-flop circuits.

3. The device according to claim 2, wherein the clock signal for low power consumption is a clock signal having a low frequency than that of the clock signal for a normal operation.

4. The device according to claim 3, further comprising a frequency divider that divides the clock signal for a normal operation to generate a clock signal for low power consumption, and inputs the generated clock signal to the clock selector.

5. The device according to claim 3, further comprising a ring oscillator that generates a clock signal for low power consumption and inputs the generated clock signal to the clock selector.

6. The device according to claim 5, wherein the ring oscillator includes a NAND circuit to which an operation-mode switching signal is input, and a plurality of inverter circuits cascade-connected to the NAND circuit.

7. The device according to claim 1, wherein the flip-flop circuit is a D flip-flop.

8. A semiconductor integrated circuit device comprising:
 a plurality of flip-flop circuits, to each clock terminal of which a clock signal is input; and
 a logic circuit to which respective outputs of the flip-flop circuits are input, wherein
 a plurality of selectors are provided respectively on an input side of each of the flip-flop circuits, which select a normal data signal to be input to the flip-flop circuits in a normal operation mode, and select an inverted output of the flip-flop circuits in a low power consumption mode, based on an operation-mode switching signal that designates switching between the normal operation mode and the low power consumption mode, and input the selected signal to a data input terminal of each of the flip-flop circuits.

9. The device according to claim 8, further comprising a plurality of clock selectors that select a clock signal for a normal operation in the normal operation mode, select a clock signal for low power consumption in the low power consumption mode, based on the operation-mode switching signal, and input the selected clock signal to a clock terminal of each of the flip-flop circuits.

10. The device according to claim 9, wherein the clock signal for low power consumption is a clock signal having a low frequency than that of the clock signal for a normal operation.

11. The device according to claim 10, further comprising a frequency divider that divides the clock signal for a normal operation to generate a clock signal for low power consumption, and inputs the generated clock signal to each of the clock selectors.

12. The device according to claim 10, further comprising a ring oscillator that generates a clock signal for low power consumption and inputs the generated clock signal to each of the clock selectors.

13. The device according to claim 12, wherein the ring oscillator includes a NAND circuit to which an operation-mode switching signal is input, and a plurality of inverter circuits cascade-connected to the NAND circuit.

14. The device according to claim 8, wherein the flip-flop circuit is a D flip-flop.

15. A countermeasure method against NBTI degradation in a semiconductor integrated circuit device, which includes a target circuit of a low power consumption mode having at least one flip-flop circuit to which a clock signal is supplied in a normal operation mode and in a low power consumption mode, and a logic circuit to which each output of the at least one flip-flop circuit is input, the method comprising:
 selecting and inputting a normal data signal to a data input terminal of each of the flip-flop circuits in the normal operation mode; and
 selecting and inputting an inverted output of each of the flip-flop circuits to the data input terminal of each of the flip-flop circuits in the low power consumption mode.

16. The method according to claim 15, wherein a clock signal for a normal operation is selected and input to a clock input terminal of each of the flip-flop circuits in the normal operation mode, and a clock signal for low power consumption is selected and input to the clock input terminal of each of the flip-flop circuits in the low power consumption mode.

17. The method according to claim 16, wherein the clock signal for low power consumption is a clock signal having a low frequency than that of the clock signal for a normal operation.

18. The method according to claim 17, wherein the clock signal for low power consumption is generated by dividing a frequency of the clock signal for a normal operation.

19. The method according to claim 17, wherein the clock signal for low power consumption is generated by a ring oscillator that operates in response to designation by the low power consumption mode.

* * * * *